United States Patent
Naik et al.

(10) Patent No.: US 11,990,368 B2
(45) Date of Patent: *May 21, 2024

(54) DOPED SELECTIVE METAL CAPS TO IMPROVE COPPER ELECTROMIGRATION WITH RUTHENIUM LINER

(71) Applicant: Applied Materials, Inc., Santa Clara, CA (US)

(72) Inventors: Mehul B. Naik, San Jose, CA (US); Zhiyuan Wu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/848,162

(22) Filed: Jun. 23, 2022

(65) Prior Publication Data
US 2022/0336271 A1    Oct. 20, 2022

Related U.S. Application Data (62) Division of application No. 15/722,639, filed on Oct. 2, 2017, now Pat. No. 11,373,903.

(Continued)

(51) Int. Cl.
*H01L 21/768* (2006.01)
*H01L 21/285* (2006.01)
*H01L 23/532* (2006.01)

(52) U.S. Cl.
CPC .. *H01L 21/76849* (2013.01); *H01L 21/28562* (2013.01); *H01L 21/76846* (2013.01);
(Continued)

(58) Field of Classification Search
CPC ......... H01L 23/53233; H01L 23/53238; H01L 23/53266; H01L 21/76849;
(Continued)

(56) References Cited

U.S. PATENT DOCUMENTS

| | | | |
|---|---|---|---|
| 5,913,147 A | 6/1999 | Dubin et al. | |
| 7,794,530 B2 | 9/2010 | Vaskelis et al. | |

(Continued)

FOREIGN PATENT DOCUMENTS

| | | | |
|---|---|---|---|
| CN | 102822949 A | 12/2012 | |
| CN | 103107120 A | 5/2013 | |

(Continued)

OTHER PUBLICATIONS

Office Action for Korean Application No. 10-2019-7012783 dated Aug. 29, 2022.

(Continued)

*Primary Examiner* — Timor Karimy
(74) *Attorney, Agent, or Firm* — Patterson + Sheridan, LLP (57) ABSTRACT

Embodiments of the present disclosure are related to improved methods for forming an interconnect structure in a substrate. In one implementation, the method includes forming a barrier layer on exposed surfaces of a feature in a dielectric layer, forming a liner layer on the barrier layer, forming a seed layer on the liner layer, forming a metal fill on the seed layer by a metal fill process and overburdening the feature using an electroplating process, performing a planarization process to expose a top surface of the dielectric layer, and selectively forming a cobalt-aluminum alloy cap layer on the barrier layer, the liner layer, the seed layer, and the metal fill by exposing the substrate to a cobalt-containing precursor and an aluminum-containing precursor.

13 Claims, 4 Drawing Sheets

Related U.S. Application Data (60) Provisional application No. 62/403,186, filed on Oct. 2, 2016.

(52) U.S. Cl.
CPC .. *H01L 21/76858* (2013.01); *H01L 21/76864* (2013.01); *H01L 21/76873* (2013.01); *H01L 21/76879* (2013.01); *H01L 21/76882* (2013.01); *H01L 21/76883* (2013.01); *H01L 23/53233* (2013.01); *H01L 23/53238* (2013.01); *H01L 23/53266* (2013.01); *H01L 2221/1089* (2013.01)

(58) Field of Classification Search
CPC ......... H01L 21/76873; H01L 21/76879; H01L 21/76882; H01L 21/76883
See application file for complete search history.

(56) References Cited

U.S. PATENT DOCUMENTS

| | | | |
|---|---|---|---|
| 8,178,439 | B2 | 5/2012 | Tohnoe et al. |
| 8,304,909 | B2 | 11/2012 | Lavoie |
| 8,349,724 | B2 | 1/2013 | Fu et al. |
| 8,623,760 | B2 | 1/2014 | Shih et al. |
| 9,508,847 | B2 | 11/2016 | Oh et al. |
| 9,634,109 | B2 | 4/2017 | Oh et al. |
| 9,780,035 | B1 | 10/2017 | Briggs et al. |
| 9,824,918 | B2 | 11/2017 | Zhou |
| 11,373,903 | B2 * | 6/2022 | Naik ................ H01L 21/76882 |
| 2008/0280432 | A1 | 11/2008 | Chang et al. |
| 2009/0320749 | A1 | 12/2009 | Yoon et al. |
| 2010/0308463 | A1 | 12/2010 | Yu et al. |
| 2011/0049716 | A1 | 3/2011 | Yang et al. |
| 2011/0244680 | A1 | 10/2011 | Tohnoe et al. |
| 2012/0104610 | A1 * | 5/2012 | Filippi .............. H01L 21/76834 438/618 |
| 2013/0062769 | A1 * | 3/2013 | Cabral, Jr. ......... H01L 21/7684 257/E23.168 |
| 2013/0112462 | A1 | 5/2013 | Yang et al. |
| 2014/0021615 | A1 | 1/2014 | Ryan et al. |
| 2014/0287577 | A1 | 9/2014 | Emesh et al. |
| 2014/0332924 | A1 | 11/2014 | Bao et al. |
| 2015/0028483 | A1 | 1/2015 | Zhou |
| 2015/0056385 | A1 * | 2/2015 | Ishizaka ............ H01L 21/76883 427/98.3 |
| 2015/0221596 | A1 | 8/2015 | Ren et al. |
| 2015/0325477 | A1 | 11/2015 | Shaviv et al. |
| 2015/0357236 | A1 | 12/2015 | Edelstein et al. |
| 2015/0380296 | A1 * | 12/2015 | Antonelli ......... H01L 21/76849 438/643 |
| 2016/0172488 | A1 | 6/2016 | Oh et al. |
| 2017/0047421 | A1 | 2/2017 | Oh et al. |

FOREIGN PATENT DOCUMENTS

| | | |
|---|---|---|
| CN | 104347476 A | 2/2015 |
| CN | 105702730 A | 6/2016 |
| JP | 2002-313913 A | 10/2002 |
| JP | 2007311799 A | 11/2007 |
| JP | 2010225682 A | 10/2010 |
| JP | 2011086787 A | 4/2011 |
| JP | 2011146711 A | 7/2011 |
| JP | 2013526012 A | 6/2013 |
| JP | 2014099627 A | 5/2014 |
| JP | 2014534609 A | 12/2014 |
| KR | 10-2016-0073143 | 6/2016 |
| WO | 2008027216 A2 | 3/2008 |
| WO | 2011123368 A1 | 10/2011 |
| WO | 2013039604 A1 | 3/2013 |

OTHER PUBLICATIONS

International Search Report and Written Opinion for International Application No. PCT/US2017/051566 dated Jan. 6, 2018.
Office Action for Taiwan Application No. 106133890 dated Mar. 26, 2020.
Search Report for Taiwan Application No. 106133890 dated Mar. 25, 2020.
Office Action for Japanese Application No. 2019-517849 dated Aug. 4, 2020.
Office Action for Korean Application No. 10-2019-7012783 dated Jul. 28, 2020.
Office Action for Korean Application No. 10-2019-7012783 dated Jan. 26, 2021.
Office Action for Japanese Application No. 2019-517849 dated Jun. 29, 2021.
Office Action for Korean Application No. 10-2019-7012783 dated Jul. 23, 2021.
Office Action for Korean Application No. 10-2019-7012783 dated Nov. 16, 2021.
Office Action for Chinese Application No. 2017800642433 dated Oct. 26, 2022.
Search Report for Chinese Application No. 2017800642433 dated Oct. 20, 2022.
Office Action for Chinese Application No. 201780064243.3 dated Jun. 7, 2023.
Search Report for Chinese Application No. 201780064243.3 dated Jun. 5, 2023.
Office Action for Korean Application No. 10-2019-7012783 dated Aug. 26, 2023.
Office Action for Korean Application No. 10-2023-7003498 dated Aug. 26, 2023.
Office Action for Korean Application No. 10-2023-7003498 dated Feb. 28, 2024.

* cited by examiner

DOPED SELECTIVE METAL CAPS TO IMPROVE COPPER ELECTROMIGRATION WITH RUTHENIUM LINER

CROSS-REFERENCE TO RELATED APPLICATIONS

This application is a divisional of U.S. non-provisional application Ser. No. 15/722,639, filed Oct. 2, 2017, which claims benefit of U.S. provisional patent application Ser. No. 62/403,186, filed Oct. 2, 2016, each of which are herein incorporated by reference in its entirety.

FIELD

Embodiments of the present disclosure generally relate to producing interconnects in semiconductor devices.

BACKGROUND

Integrated circuits (IC) include various semiconductor devices formed within or on layers of dielectric material that overlies a substrate. Such devices which may be formed in or on the dielectric layers include transistors, bipolar transistors, diodes, and resistors. Other devices which may be formed in or on the dielectric material include thin film resistors and capacitors. Metal lines interconnect the semiconductor devices to power such devices and enable such devices to share and exchange information. Such interconnects extend horizontally between devices within a dielectric layer as well as vertically between dielectric layers. These metal lines are connected to each other by a series of interconnects. The interconnects or metal lines are first patterned into the dielectric layers to form vertical and horizontal recessed features (vias and trenches) that are subsequently filled with metal. The resulting layer containing metal-filled lines residing in a dielectric is referred to as a metallization layer.

Copper has become widely adopted to form multilevel interconnects required in today's ultra large scale integration (ULSI) semiconductor devices, due to its lower resistivity compared to aluminum and its improved electro-migration resistance. Electro-migration occurs when the metal atoms of conductive lines are subjected to high current density (e.g., when the circuit is in operation). Metal atoms migrate in the direction of electron flow if the current density is high enough, thereby forming voids where metal ions have departed and forming extrusions consisting of metal material protruding outside the metal or dielectric barrier along the length of the metal interconnect. Voids will cause the copper interconnect to thin out and eventually separate completely, causing an open circuit. Moreover, extrusions can cause the copper metal to extend past the copper interconnect and into an adjacent copper line, thereby causing a short circuit. Therefore, copper interconnect needs to meet electron-migration requirement.

In addition, as critical CD shrinks, it is difficult to achieve voids free Cu gap-fill by conventional approach. To avoid formation of voids during copper filling, a liner layer, such as ruthenium liner, has been used to promote copper reflow on top of the liner layer, which leads to voids free gap-fill for small trenches and vias. However, copper moves easily on the liner layer and would also result in electro-migration failure.

Traditional approach of electro-migration improvement is done through selective cobalt cap to improve the adhesion between Cu and dielectric barrier. However, cobalt cap was found to diffuse to liner area and lose its original purpose of electro-migration improvement. Therefore, there is a need in the art to provide an improved method that reduces cobalt diffusion and improves electro-migration.

SUMMARY

Implementations of the present disclosure provide an improved method for forming an interconnect structure in a workpiece. In one implementation, the method includes forming a barrier layer on exposed surfaces of a feature in a dielectric layer, forming a liner layer on the barrier layer, forming a seed layer on the liner layer, forming a metal fill on the seed layer by a metal fill process and overburdening the feature using an electroplating process, performing a planarization process to expose a top surface of the dielectric layer, and selectively forming a cobalt-aluminum alloy cap layer on the barrier layer, the liner layer, the seed layer, and the metal fill by exposing the substrate to a cobalt-containing precursor and an aluminum-containing precursor.

In yet another embodiment, an interconnect structure for a semiconductor device is provided. The structure includes a substrate comprising a metal region, a dielectric region surrounding the metal region, and an intermediate region disposed between the metal region and the dielectric region, the intermediate region comprising a barrier layer adjacent to the dielectric region, a liner layer formed on the barrier layer, and a seed layer formed on the liner layer, and a cobalt-containing alloy cap layer formed on the metal region and the intermediate region.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Implementations of the present disclosure are directed to methods of processing workpieces, such as semiconductor wafers or devices. The terms workpiece, wafer, and semiconductor wafer may refer to any flat media or article, including semiconductor wafers and other substrates or wafers, glass, mask, and optical or memory media, MEMS substrates, or any other workpiece having micro-electric, micro-mechanical, or microelectro-mechanical devices. The term "workpiece" as used herein may also include all structures and layers that have been previously deposited and formed at a given point in the processing, and are not limited to just those structures and layers as depicted in the Figures.

Figure 1:
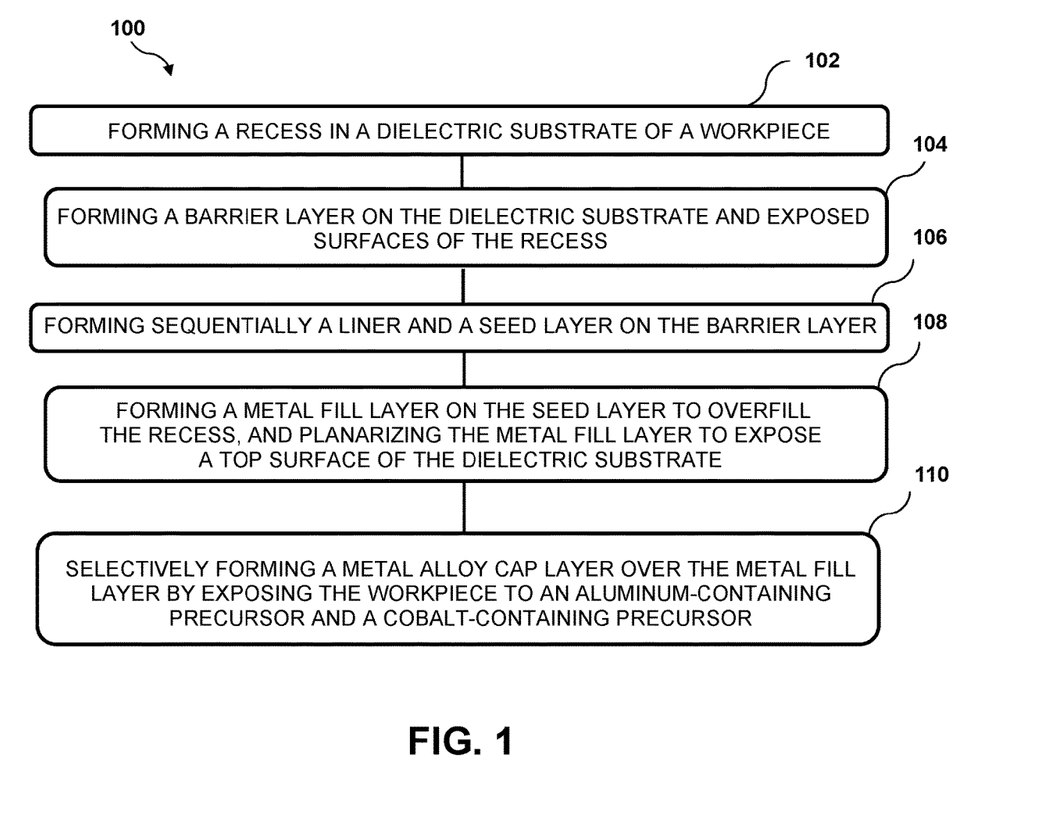
FIG. 1 depicts a flow chart of a method for manufacturing interconnect structure in the features of workpieces which include trenches and vias.

FIG. 1 depicts a flow chart of a method 100 for manufacturing interconnect structure in the features of workpieces which may include trenches and vias. In some implementations, the method may be used to produce small feature interconnects, for example, features having a width or diameter of less than 30 nm or less, for example 14 nm or less, for example 10 nm or less. However, it should be appreciated that the methods of the present disclosure are applicable to any feature size. The dimension sizes discussed in the present disclosure may be post-etch feature dimensions at the top opening of the feature. The methods described herein may be applied to various forms of copper, cobalt, nickel, gold, silver, manganese, tin, aluminum, and alloy deposition, for example, in Damascene applications, either single or dual Damascene application.

Although generally described as metal deposition in the present disclosure, it should be appreciated that the term "metal" may also contemplate metal alloys. Such metals and metal alloys may be used to form seed layers or to fully or partially fill the feature. Exemplary copper alloys may include, but are not limited to, copper manganese and copper aluminum. As a non-limiting example, the alloy composition ratio may be in the range of about 0.1% to about 10% secondary alloy metal, as compared to the primary alloy metal (e.g., Cu, Co, Ni, Ag, Au, Mn, Sn or Al).

FIG. 1 is illustratively described with reference to FIGS. 2A-2E, which show cross-sectional views of a simplified, conceptual interconnects during various stages of fabrication according to the flow chart of FIG. 1. Those skilled in the art will recognize that the structures of FIGS. 2A-2E, while generally drawn to illustrate approximate relative sizes or dimensions for ease of understanding, are not drawn to scale. Those skilled in the art will further recognize that the full process for forming interconnects and the associated structures are not illustrated in the drawings or described herein. Instead, for simplicity and clarity, only so much of a process for forming interconnects and the associated structures as is unique to the present disclosure or necessary for an understanding of the present disclosure is depicted and described. In addition, although various steps are illustrated in the drawings and described herein, no limitation regarding the order of such steps or the presence or absence of intervening steps is implied. Steps depicted or described as sequential are, unless explicitly specified, merely done so for purposes of explanation without precluding the possibility that the respective steps are actually performed in concurrent or overlapping manner, at least partially if not entirely.

Figure 2A:
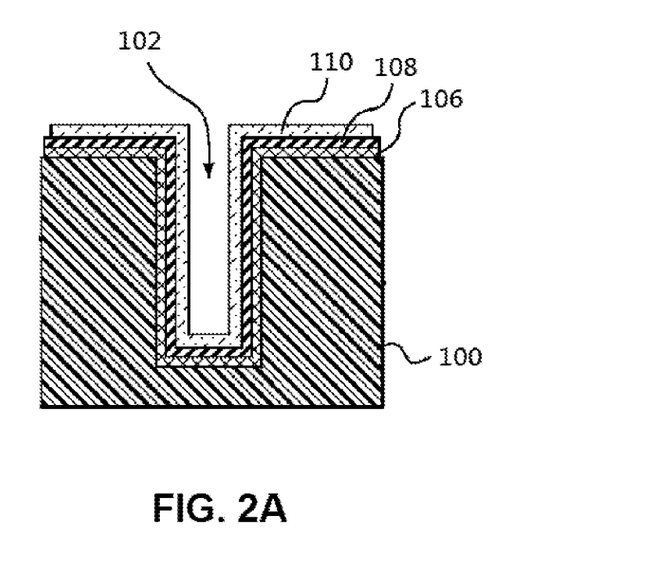
FIGS. 2A-2E depict cross-sectional views of a simplified, conceptual interconnect structure during various stages of fabrication according to the flow chart of FIG. 1.

The method 100 begins at block 102 by forming a recess 102 in a substrate 100 of a workpiece, as shown in FIG. 2A. The recess 102 represents an electrical connecting structure such as a trench in which an interconnect line feature may be formed in the later stage. It is contemplated that the method described herein may also be applied to other types of interconnects, such as via structures or dual damascene trench and via structures, where an underlying metal region (not shown) is to be contacted by the interconnect feature. Hence, the recess 102 may be a trench, a via opening, a combined trench and via opening, or any vertical and horizontal features. The recess 102 may be formed using any suitable lithography/etching technology.

The substrate 100 may represent an interlayer dielectric layer disposed between a device layer or metallization layer and another metallization layer. The substrate 100 may be any dielectric layer or a combination of dielectric layers. In one exemplary implementation, the substrate is a low dielectric constant material. Low dielectric constant materials refer to those with dielectric constant less than 4, for example less than 3.6. Examples of low dielectric constant materials may include silicon and nitrogen containing materials or silicon and carbon containing materials or combinations thereof. Some exemplary low dielectric constant materials may include hydrogenated silicon carbon oxide (SiCOH), porous dielectric materials such as porous SiCOH, or organic materials. In some implementations, the substrate may include a silicon and oxygen containing material having a dielectric constant around 4.

At block 104, an optional barrier layer 106 is formed on the substrate 100, as shown in FIG. 2A. The barrier layer 106 may be formed (e.g., conformally) on exposed surfaces of the substrate 100 so as to line the recess 102, thereby preventing diffusion of metal into the substrate 100. Suitable barrier layers 106 may include, for example, Ta, Ti, TiN, TaN, Mn, MnN, or a combination thereof. Suitable barrier deposition methods may include physical vapor deposition (PVD), atomic layer deposition (ALD), or chemical vapor deposition (CVD). In one implementation, the barrier layer 106 is a PVD TaN. In another implementation, the barrier layer 106 is a bi-layer of ALD TaN and PVD TaN. In yet another implementation, the barrier layer 106 is a bi-layer of PVD TaN and PVD Ta. In cases where TaN and Ta were used, the PVD TaN may have a thickness of about 2-25 Angstroms (Å) and the PVD Ta may have a thickness of about 2-25 Å. Barrier layers are typically used to isolate copper or copper alloys from substrate. However, it should be appreciated that in the case of other metal interconnects, diffusion may not be an issue and therefore a barrier layer may not be required.

At block 106, an intermediate layer 108 is formed (e.g., conformally) on the exposed surfaces of the barrier layer 106, as shown in FIG. 2A. The intermediate layer 108 may be a single layer, such as a PVD copper seed layer, or a layer stack composed of a liner layer and a seed layer (as a non-limiting example, a CVD Ru liner layer and a PVD copper seed layer). It should be appreciated, however, that other methods of depositing the intermediate layer 108 are also contemplated by the present disclosure. In one implementation, the intermediate layer 108 is a Ru liner layer and a copper seed layer deposited on the Ru liner layer.

Figure 2B:
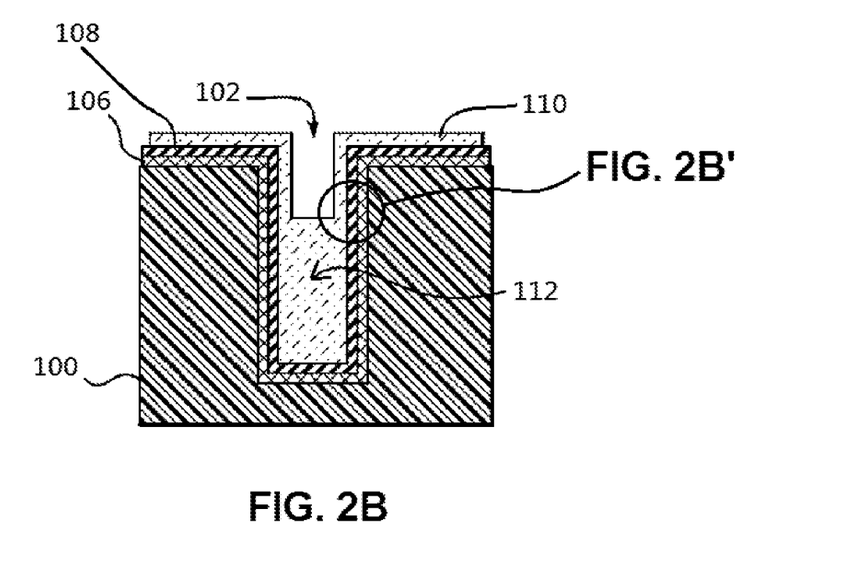

FIG. 2B' shows one implementation where the intermediate layer 108 is a layer stack having a liner layer 130 and a seed layer 132. The seed layer 132 may be a thin, continuous wetting (bonding) layer of metal, such as copper, cobalt, nickel, gold, silver, manganese, tin, aluminum, ruthenium, and alloys thereof. The seed layer 132 may be deposited using PVD, ALD, CVD, or any suitable deposition method. The seed layer 132 may be doped with manganese, aluminum, gold, calcium, zinc, cadmium, silver tin, or other suitable material to increase electro-migration performance. In one implementation, the seed layer 132 is copper doped with manganese (Mn) (e.g., CuMn alloy). The manganese (Mn) concentration of the copper manganese alloy may range between about 0.1% to about 10% in weight. In one implementation, the seed layer 132 is copper doped with aluminum (Al) (e.g., CuAl alloy). The Al concentration of the copper aluminum alloy may range between about 0.1% to about 10% in weight. The use of the doped Cu seed layer (e.g., CuMn) is believed to increase electro-migration performance.

The liner layer 130 helps mitigate discontinuous seed issues and improve adhesion of the seed layer 132 to the barrier layer 106. The liner layer 130 also promotes subsequent copper reflow on the liner layer 130, leading to voids free gap-fill for small trench and via. In one implementation, the liner layer 130 is Ru. In one implementation, the liner layer 130 is Co. Liner layers may be noble metals such as Pt, Pd, and Os, but the list may also include Ni. The liner layer 130 may be formed by CVD, PVD, ALD, or other suitable deposition techniques. The thickness of the liner layer 130 may be in the range of around 5 Å to 50 Å for Damascene applications.

At block 108, once the liner layer 130 and the seed layer 132 have been deposited, a metal fill layer 110 is formed on the intermediate layer 108, as shown in FIG. 2A. The metal fill layer 110 may be formed by a sputtering process. If some cases, the seed layer 132 and the metal fill layer 110 may both be carried out using a sputtering process. In such case, the seed layer 132 and the metal fill layer 110 may be a continuous deposition performed in a single process chamber. The seed layer 132 will thus merge with the metal fill layer 110 and shows no clear boundary between the metal fill layer 110 and the seed layer 132. The metal fill layer 110 may also be formed using metal fill techniques which provide a layer of metal, such as PVD, CVD, ALD, evaporation, or other suitable deposition techniques, for example an electrochemical deposition (ECD) deposition process such as electroplating.

Suitable materials for the metal fill layer 110 may include, but are not limited to Cu, Co, Ni, Au, Ag, Mn, Sn, W and Al, etc. In one implementation, the metal fill layer 110 is a layer of copper deposited by the ECD deposition process. The ECD deposition process may use acid deposition chemistry, which may include, for example, copper sulfate, sulfuric acid, hydrochloric acid, and organic additives (such as accelerators, suppressors, and levelers). It should be appreciated, however, that acidic chemistries using proper organic additives may also be used to achieve ECD deposition. After the ECD deposition, the substrate 100 may be subjected to the spin, rinse, and dry (SRD) process or other cleaning processes. The metal fill layer 110 is then heated to a temperature high enough to reflow the metal fill layer 110, but not enough to damage or degrade the workpiece or elements on the workpiece. The use of Ru liner layer or Ru seed layer is believed to enhance reflow of copper on ruthenium.

The metal fill layer 110 may be optionally heated using an annealing process or a suitable thermal treatment process. In various implementations of the present disclosure, the metal fill layer 110 is flowable when subjected to thermal treatment or annealing. The temperature may be in the range of about 100° C. to about 500° C. for metal layer reflow in the recess 102. Appropriate thermal treatment or annealing temperatures are in the range of about 100° C. to about 500° C., and may be accomplished with equipment capable of maintaining sustained temperatures in the range of about 100° C. to about 400° C., for example within the temperature range of about 250° C. to about 350° C. The thermal treatment or annealing results in reflow of some or all of the metal fill layer 110.

In some implementations, the metal fill layer 110 is formed on the seed layer 132 using a metal reflow process, which includes a deposition process such as CVD, PVD, ALD, or any other suitable deposition process, followed by a heating process such as an annealing or any suitable thermal treatment process to reflow the deposited metal fill layer. Thereafter, the recess 102 is overburdened by an electroplating process or the same deposition process.

The thermal treatment or annealing process discussed herein may be performed using a forming or inert gas, pure hydrogen, or a reducing gas such as ammonia ($NH_3$). During reflow, the shape of the deposition changes, such that the metal deposit may pool in the bottom of the feature (i.e., bottom-up filling). In addition to reflow during the thermal treatment process, the metal deposit may also grow larger grains and reduce film resistivity. An inert gas may be used to cool the workpiece after heating.

Figure 2C:
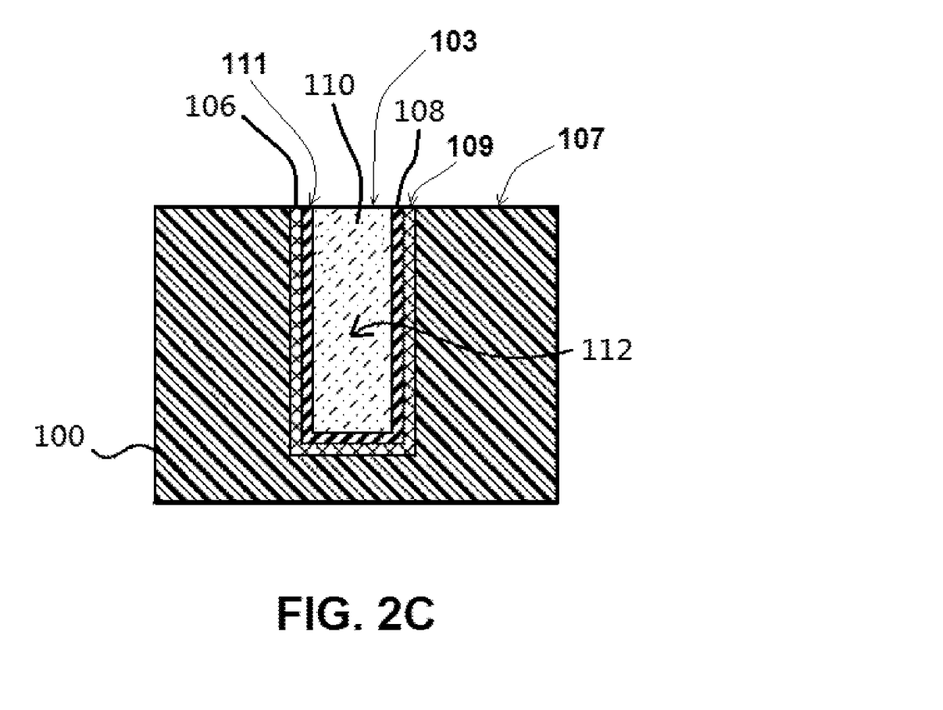

The thermal treatment or annealing may be performed so as to partially fill the recess 102. In one implementation, the metal fill layer 110 flows into the recess 102 to form a partially fill section 112, as shown in FIG. 2B. In some implementations, the ECD deposition and reflow steps discussed herein may be repeated until the desired characteristics of filling (i.e., fill section 112) are reached. In this regard, processes may include one or more ECD deposition process, cleaning (such as SRD), and thermal treatment cycles to obtain substantially void-free fill of features. The number of repeating steps may depend on the size of the structure, for example. In one implementation, the ECD deposition and reflow processes are repeated to fully fill or overfill the recess 102 with the metal fill layer 110, as shown in FIG. 2C. The metal fill layer 110 may overfill the recess 102 to a thicknesses from 5 nm to 1,000 nm. The thickness of the metal fill layer 110 is properly chosen to serve as a basis for the subsequent CMP process. Thereafter, the excessive metal fill layer 110 is etched back using a chemical mechanical polishing (CMP) process to expose a top surface 107 of the substrate 100, a top surface 109 of the barrier layer 106 (if used), and a top surface 111 of the intermediate layer 108. Therefore, the top surface 107 of the substrate 100, the top surface 109 of the barrier layer 106 (if used), the top surface 111 of the intermediate layer 108 and a top surface 103 of the metal fill layer 110 are substantially co-planar, as shown in FIG. 2C.

Figure 2D:
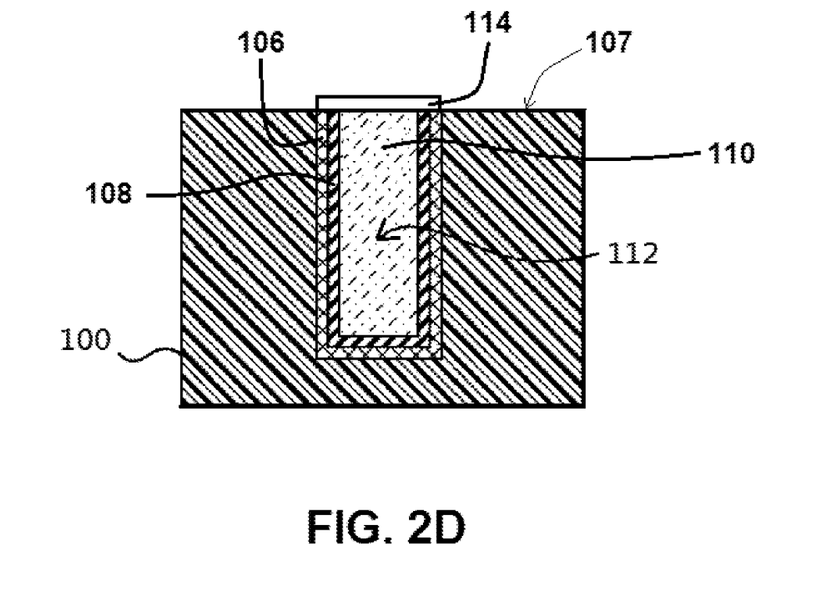

At block 110, a metal cap layer 114 is selectively formed on the metal fill layer 110 that has been fully filled within the recess 102, as shown in FIG. 2D. In some implementations, portions of the metal cap layer 114 are extended to the top surface 109 of the barrier layer 106 and the top surface 111 of the intermediate layer 108, as shown in FIG. 2C. The selective deposition process does not form the metal cap layer 114 on the top surface 107 of the substrate 100 to prevent it from shorting the neighboring lines/conductive elements. The metal cap layer 114 is believed to improve electro-migration performance of the underlying copper filling by increasing Cu and dielectric barrier adhesion.

Suitable materials for the metal cap layer 114 may include, but are not limited to Co, Ni, Au, Ag, Mn, Sn, W, Al, any combinations thereof, or any other metal material, depending on the application of the metal interconnections. In one implementation, the metal cap layer 114 is formed of or at least includes cobalt. Selective deposition process may be precursor and surface dependent. The selective deposition process may be performed using any suitable technique such as a plasma treatment, a PECVD, PEALD, or any combinations thereof. Alternatively, the selective deposition process may be performed using a thermal surface treatment with different chemistry (without plasma) to achieve selectivity. The metal cap layer 114 may also be applied using plating, electroplating or other suitable deposition techniques such as CVD, PVD, ALD, etc.

Figure 2E:
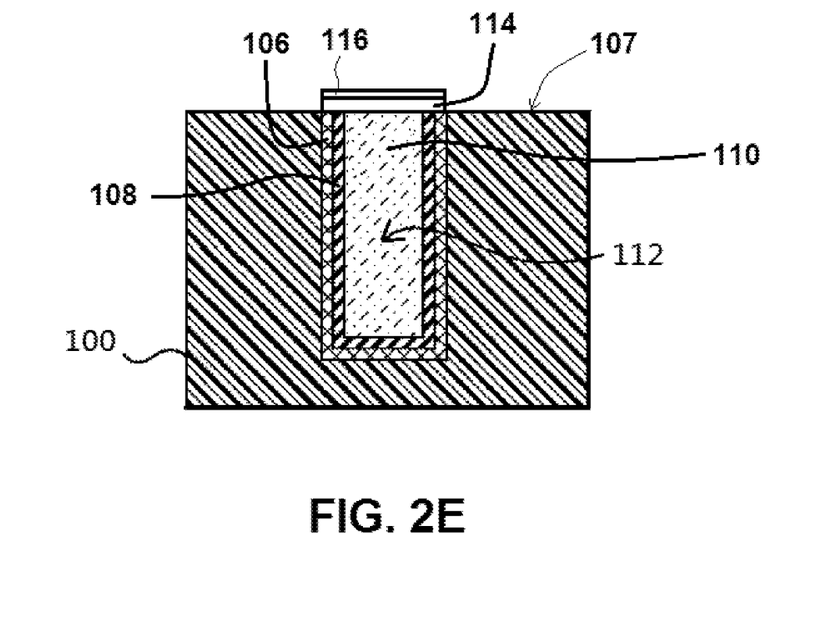

During formation of the metal cap layer 114, the substrate 100 is exposed to an aluminum-containing precursor to dope and react with the metal cap layer 114 as shown in FIG. 2D, or form an alloy layer 116 on at least the top surface of the metal cap layer 114, as shown in FIG. 2E. In one exemplary implementation where the metal cap layer 114 is formed from cobalt, exposure of the workpiece to the aluminum-containing precursor can selectively turn the metal cap layer 114 into a cobalt-containing alloy, and/or form a cobalt-containing alloy, for example a cobalt-aluminum alloy (i.e., the alloy layer 116), on the metal cap layer 114. In some implementations, the metal cap layer 114 or the cobalt-aluminum alloy 116 may be formed by a selective Co deposition followed by selective Al deposition. In some implementations, the metal cap layer 114 or the cobalt-aluminum alloy 116 may be formed by a selective Al deposition followed by selective Co deposition. In some implementations, the cobalt-aluminum alloy 116 may be formed by a selective cyclic process such as Co—Al—Co—Al depositions. In such a case, the substrate 100 may be exposed to a cobalt-containing precursor and an aluminum-containing precursor in an alternating manner until a desired thickness is reached. In some implementations, the cobalt-aluminum alloy 116 may be formed by co-flowing a cobalt-containing precursor and an aluminum-containing precursor.

Suitable cobalt-containing precursors include cobalt precursors, such as methylcyclopentadienyl cobalt bis(carbonyl) (MeCpCo(CO)$_2$), ethylcyclopentadienyl cobalt bis(carbonyl) (EtCpCo(CO)$_2$), dicobalt octa(carbonyl) (Co$_2$(CO)$_8$), and nitrosyl cobalt tris(carbonyl) ((ON)Co(CO)$_3$. Suitable cobalt-containing precursors also include carbonyl compounds or complexes, such as cyclopentadienyl cobalt bis(carbonyl) (CpCo(CO)$_2$), tricarbonyl allyl cobalt ((CO)$_3$Co(CH$_2$CH=CH$_2$)), dicobalt hexacarbonyl bytylacetylene (CCTBA, (CO)$_6$Co$_2$(HCECtBu)), dicobalt hexacarbonyl methylbytylacetylene ((CO)$_6$Co$_2$(MeCECtBu)), and dicobalt hexacarbonyl phenylacetylene ((CO)$_6$Co$_2$(HCECPh)). Suitable cobalt-containing precursors also include cobalt amidinates or cobalt amido complexes, such as bis(di(butyldimethylsilyl)amido) cobalt (((BuMe$_2$Si)$_2$N)$_2$Co), bis(di(ethyidimethylsilyl)amido) cobalt (((EtMe$_2$Si)$_2$N)$_2$Co), bis(di(propyidimethylsilyl)amido) cobalt (((PrMe$_2$Si)$_2$N)$_2$Co), and bis(di(trimethylsilyl)amido) cobalt (((Me$_3$Si)$_2$N)$_2$Co).

Suitable aluminum-containing precursor may include, but are not limited to dimethylaluminum hydride (DMAH), trimethylaluminum (TMA, Al$_2$Me$_6$ or (AlMe$_3$)$_2$), triethylaluminum (Al$_2$Et$_6$, (AlEt$_3$)$_2$, or TEA), tritertiarybutyl aluminium (TTBA), aluminum hydride (AlH$_3$), and combinations thereof. In one implementation, the aluminum-containing precursor is DMAH.

As cobalt in the metal cap layer 114 may move away and diffuse into underlying copper filling or liner area (e.g., intermediate layer 108), the formation of the cobalt-aluminum alloy can hold the cobalt within the metal cap layer 114 and at or near the interface between the metal cap layer 114 and the fill section 112, thereby preventing or reducing undesirable cobalt migration into the liner layer 130, the intermediate layer 108, 132 and/or the metal fill layer 110, and thus improving overall electro-migration efficacy.

The metal cap layer 114 or the cobalt-aluminum alloy layer 116 may be formed using any suitable technique such as a CVD method, although other deposition techniques such as PVD or ALD may also be used. The aluminum-containing precursor may be introduced into a processing chamber in which the workpiece is positioned at a flow rate of about 10 sccm to about 3,000 sccm, for example about 20 sccm to about 1,500 sccm, such as about 30 sccm to about 200 sccm (for a 300 mm substrate). The temperature of the workpiece or the substrate pedestal during process may be within a range from about 200° C. to about 800° C., such as about 350° C. to about 550° C., for example about 400° C. to about 500° C. In another implementation, the workpiece may be heated and maintained at a temperature within a range from about 100° C. to about 600° C., such as about 120° C. to about 500° C., for example about 150° C. to about 425° C. The processing chamber may have a controlled environment that is pressurized within a range from about 1 mTorr to about 100 Torr, such as about 1 Torr to about 10 Torr, for example about 2 Torr to about 5 Torr. The thickness of the resulting alloy layer 116 may be about 2 Å to about 200 Å, for example about 5 Å to about 40 Å.

In some implementations, the metal cap layer 114 or the cobalt-aluminum alloy layer 116 may be thermally treated at a temperature between about 100° C. to about 500° C. in an environment containing hydrogen and/or argon. In some implementations, the alloy layer 116 may be thermally treated or annealed at a temperature between about 100° C. to about 500° C. in a forming gas environment containing hydrogen or nitrogen. For example, the forming gas environment may contain about 3-5% hydrogen in nitrogen or 3-5% hydrogen in helium. The thermal or annealing treatment removes any unwanted surface oxides, densify the layer structures, and improve the surface properties of the alloy layer 116. The substrate or workpiece may additionally be passivated by soaking in gaseous nitrogen (N$_2$ or NH$_3$ gas) or other passifying environments to prevent surface oxidation.

While aluminum-containing precursor is discussed herein, it should be appreciated that other doping precursor, such as Ru, Mn, or W, may also be used to react with the metal cap layer 114 to turn the metal cap layer 114 and/or form an alloy layer thereon. The doping precursor should be chosen to prevent or reduce migration or diffusion of the cobalt (or other metal used by the metal cap layer 114) into the copper filling or liner area (e.g., intermediate layer 108). It is contemplated that the doping precursor may vary depending on the material of the metal cap layer 114.

After block 112, a plurality of fabrication techniques may be employed to complete the metal interconnects or to form other features that are needed to complete the semiconductor device.

Benefits of the present disclosure include minimized electro-migration of metal atoms of a metallization structure by exposing a selective cobalt cap layer formed on a copper line to an aluminum-containing precursor. The aluminum of the aluminum-containing precursor reacts with the selective cobalt cap layer and forms a cobalt-aluminum alloy, which prevents or reduces undesirable migration or diffusion of cobalt into liner and/or seed region disposed underneath the copper line. The cobalt-aluminum alloy gives full impact of having the selective cobalt cap layer that is used to minimize electro-migration of the copper line in the metal interconnects. As a result, overall electro-migration efficacy is improved.

While the foregoing is directed to embodiments of the present disclosure, other and further embodiments of the disclosure may be devised without departing from the basic scope thereof.

What is claimed is:
1. A method for forming a structure in a substrate, comprising:
   forming a barrier layer on exposed surfaces of a feature in a dielectric layer of the substrate;
   forming a liner layer on the barrier layer, the liner layer comprising Ru, Pt, Pd, Os, or Ni material, wherein the Ru, Pt, Pd, Os, or Ni material of the liner layer is not present in the barrier layer;
   forming a seed layer on the liner layer;

forming a metal fill on the seed layer by a metal fill process and overburdening the feature using an electroplating process;

performing a planarization process to expose a top surface of the dielectric layer; and selectively forming a cobalt-aluminum alloy cap layer having a first cap layer of cobalt and a second cap layer of cobalt-aluminum alloy, the cobalt-aluminum alloy cap layer formed on the barrier layer, the liner layer, the seed layer, and the metal fill by exposing the substrate to a cobalt-containing precursor for forming the first cap layer and then an aluminum-containing precursor for forming the second cap layer, wherein the cobalt-aluminum alloy cap layer extends onto the liner layer.

2. The method of claim 1, wherein the substrate is exposed to the aluminum-containing precursor and the cobalt-containing precursor in an alternating manner until a desired thickness of the cobalt-aluminum alloy cap layer is reached.

3. The method of claim 1, wherein the substrate is exposed to the aluminum-containing precursor and the cobalt-containing precursor at the same time.

4. The method of claim 1, wherein the liner layer comprises Ru and the seed layer comprises copper.

5. The method of claim 4, wherein the seed layer is a pure copper.

6. The method of claim 4, wherein the seed layer is a copper manganese (CuMn) alloy having Mn concentration of about 0.1% to about 10% in weight.

7. The method of claim 1, wherein the seed layer is a copper aluminum (CuAl) alloy having Al concentration of about 0.1% to about 10%.

8. The method of claim 1, wherein the metal fill is formed by a copper reflow using PVD, CVD, ALD, evaporation, or an electroplating process.

9. A method for forming a structure in a substrate, comprising:

forming a barrier layer on exposed surfaces of a feature in a dielectric layer of the substrate;

forming an Ru liner layer on the barrier layer, wherein Ru is not present in the barrier layer;

forming a copper containing seed layer on the liner layer;

forming a metal fill on the seed layer by a metal fill process and overburdening the feature using an electroplating process;

performing a planarization process to expose a top surface of the dielectric layer; and selectively forming a cobalt-aluminum alloy cap layer on the barrier layer, the liner layer, the seed layer, and the metal fill by exposing the substrate to a cobalt-containing precursor for forming a first layer of cobalt and an aluminum-containing precursor for forming a second layer of cobalt-aluminum alloy, wherein the cobalt-aluminum alloy cap layer extends onto the liner layer, wherein the substrate is exposed to the aluminum-containing precursor and the cobalt-containing precursor in an alternating manner or at the same time until a desired thickness of the cobalt-aluminum alloy cap layer is reached.

10. The method of claim 9, wherein the seed layer is a pure copper.

11. The method of claim 9, wherein the seed layer is a copper manganese (CuMn) alloy having Mn concentration of about 0.1% to about 10% in weight.

12. The method of claim 9, wherein the seed layer is a copper aluminum (CuAl) alloy having Al concentration of about 0.1% to about 10%.

13. The method of claim 9, wherein the metal fill is formed by a copper reflow using PVD, CVD, ALD, evaporation, or an electroplating process.

* * * * *